United States Patent
Zhang et al.

(10) Patent No.: US 9,558,852 B2
(45) Date of Patent: Jan. 31, 2017

(54) METHOD AND APPARATUS FOR DEFECT REPAIR IN NAND MEMORY DEVICE

(71) Applicant: Advantest Corporation, Tokyo (JP)

(72) Inventors: Xinguo Zhang, San Jose, CA (US); Ze'ev Raz, San Jose, CA (US); Yang Liu, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 14/687,709

(22) Filed: Apr. 15, 2015

(65) Prior Publication Data

US 2015/0294741 A1 Oct. 15, 2015

(30) Foreign Application Priority Data

Apr. 15, 2014 (CN) .......................... 2014 1 0151031

(51) Int. Cl.
*G11C 11/34* (2006.01)
*G11C 29/00* (2006.01)
*G11C 29/44* (2006.01)
*G11C 16/04* (2006.01)

(52) U.S. Cl.
CPC .............. *G11C 29/78* (2013.01); *G11C 29/82* (2013.01); *G11C 16/0483* (2013.01); *G11C 2029/4402* (2013.01)

(58) Field of Classification Search
None
See application file for complete search history.

(56) References Cited

U.S. PATENT DOCUMENTS

2009/0161431 A1* 6/2009 Hsiao ............... G11C 29/44
365/185.09

* cited by examiner

*Primary Examiner* — Son Dinh
*Assistant Examiner* — Sultana Begum

(57) ABSTRACT

System and method of selecting defective columns in NAND memory devices for repair. After locating the defective blocks and defective columns in a NAND memory device, a weight value is calculated for each defective block by dividing a total number of defective blocks that would be inherently repaired as a result of repairing the respective defective block by a number of defective data columns in the respective defective block. A defective block with the greatest weight value is selected for repair in which the defective columns in the selected block are substituted by redundant columns. Other defective blocks with defective columns having the same column addresses with the defective columns in the selected defective block are automatically selected for repair as well. Remaining defective columns are selected for repair by iteratively updating weight values and selecting a defective block that has the greatest weight value among the remaining defective blocks.

17 Claims, 12 Drawing Sheets

FIG. 3

| Blocks | Columns 0 | 1 | 2 | 3 | 4 | 5 | 6 | 7 | 8 | 9 | A | B | C | D | E | F | Redundant Columns 0 | 1 | 2 | 3 | 4 | Number of Defective Columns | Coverage of Block | Weight of Block | Remaining Redundant Columns |
|---|---|---|---|---|---|---|---|---|---|---|---|---|---|---|---|---|---|---|---|---|---|---|---|---|---|
| 0 | R | | | | | | | | | | | | | | | | | | | | | 3 | 4 | 1.33 | 5 |
| 1 | | | | | R | R | R | | | | | | | | | | | | | | | 4 | 3 | 0.75 | 5 |
| 2 | | | | | R | R | | | | | | | | | | | | | | | | 2 | 1 | 0.50 | 5 |
| 3 | R | | | | | | R | | | | | | | | | | | | | | | 2 | 2 | 1.00 | 5 |
| 4 | | | R | | | | R | | | | | B | | | | | | | | | | 2 | 1 | 0.50 | 5 |
| 5 | | | | | | | | | | | | | | | R | | | | | | | 1 | 1 | 1.00 | 5 |
| 6 | | | | R | | | | | | | | | | | | | | | | | | 1 | 1 | 1.00 | 5 |
| 7 | | | | | R | | | | | | | | | | | | | | | | | 1 | 1 | 1.00 | 5 |
| 8 | | | | | | | | R | | | | | | | | | | | | | | 1 | 1 | 1.00 | 5 |

| Blocks | Columns 0-3 (Redundant) | Columns 4-F | Redundant Columns 0-4 | Number of Defective Columns | Coverage of Block | Weight of Block | Remaining Redundant Columns | |
|---|---|---|---|---|---|---|---|---|
| 0 | hatched | | | | | | | |
| 1 | | R at 4,5,6 | | 4 | | | 2 | Repaired |
| 2 | hatched | R at 5,6 | | 2 | 1 | 0.50 | 2 | Unrepairable |
| 3 | hatched | | | | | | 2 | |
| 4 | | R at B, R at 6 | | 2 | 1 | 0.50 | 2 | Repaired |
| 5 | | | | | | | 2 | |
| 6 | | R at 4, R at E | | | | | 2 | |
| 7 | | R at 7 | | 1 | 1 | 1.00 | 2 | Repaired |
| 8 | hatched | | | 1 | 1 | 1.00 | 2 | Repaired |

FIG. 4

| Blocks | Columns 0 | 1 | 2 | 3 | 4 | 5 | 6 | 7 | 8 | 9 | A | B | C | D | E | F | Redundant Columns 0 | 1 | 2 | 3 | 4 | Number of Defective Columns | Coverage of Block | Weight of Block | Remaining Redundant Columns | |
|---|---|---|---|---|---|---|---|---|---|---|---|---|---|---|---|---|---|---|---|---|---|---|---|---|---|---|
| 0 | ▨ |   |   |   |   |   |   |   |   |   |   |   |   |   |   |   | ▨ | ▨ | ▨ | ▨ |   |   |   |   |   |   |
| 1 |   |   |   |   |   | R | R |   |   |   |   |   |   |   |   |   | ▨ | ▨ | ▨ | ▨ |   | 3 |   |   | 1 | Repaired |
| 2 |   |   |   |   |   | R | R |   |   |   |   |   |   |   |   |   | ▨ | ▨ | ▨ | ▨ |   | 2 |   |   | 1 | Unrepairable |
| 3 |   |   |   |   |   |   |   |   |   |   |   |   |   |   |   |   | ▨ | ▨ | ▨ | ▨ |   |   |   |   | 1 | Unrepairable |
| 4 |   |   |   |   |   |   | R |   |   |   |   | R |   |   |   |   | ▨ | ▨ | ▨ | ▨ |   | 2 |   |   | 1 | Repaired |
| 5 |   |   |   |   |   |   |   |   |   |   |   |   |   |   |   |   | ▨ | ▨ | ▨ | ▨ |   |   |   |   | 1 | Unrepairable |
| 6 |   |   |   |   |   |   |   |   |   |   |   |   |   |   |   |   | ▨ | ▨ | ▨ | ▨ |   | 2 |   |   | 1 | Repaired |
| 7 |   |   |   |   |   |   |   | R |   |   |   |   |   |   |   |   | ▨ | ▨ | ▨ | ▨ |   |   |   |   | 1 | Repaired |
| 8 | ▨ |   |   |   |   |   |   |   |   |   |   |   |   |   | R |   | ▨ | ▨ | ▨ | ▨ |   | 1 | 1 | 1.00 | 1 | Repaired |

| Blocks | Columns | | | | | | | | | | | | | | | | | Redundant Columns | | | | | Number of Defective Columns | Coverage of Block | Weight of Block |
|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | A | B | C | D | E | F | 0 | 1 | 2 | 3 | 4 | | | |
| 0 | R | | R | R | | R | | | | ▨ | ▨ | ▨ | ▨ | ▨ | ▨ | | ▨ | ▨ | ▨ | ▨ | ▨ | 5 | 1 | 0.20 |
| 1 | | | R | R | R | R | R | | | ▨ | ▨ | ▨ | ▨ | ▨ | ▨ | | ▨ | ▨ | ▨ | ▨ | ▨ | 5 | 1 | 0.20 |
| 2 | R | | R | R | R | | | R | | ▨ | ▨ | ▨ | ▨ | ▨ | ▨ | | ▨ | ▨ | ▨ | ▨ | ▨ | 4 | 1 | 0.25 |
| 3 | R | | | R | R | R | | | R | ▨ | ▨ | ▨ | ▨ | ▨ | ▨ | | ▨ | ▨ | ▨ | ▨ | ▨ | 5 | 1 | 0.20 |
| 4 | | | | | | | | | | R | R | | | | | | ▨ | ▨ | ▨ | ▨ | ▨ | 2 | 1 | 0.50 |
| 5 | | | | | | | | | | R | | R | R | | | | ▨ | ▨ | ▨ | ▨ | ▨ | 2 | 1 | 0.50 |
| 6 | | | | | | | | | | | | R | | | | | ▨ | ▨ | ▨ | ▨ | ▨ | 1 | 1 | 1.00 |
| 7 | | | | | | | | | | | | | | | R | | ▨ | ▨ | ▨ | ▨ | ▨ | 1 | 1 | 1.00 |
| 8 | | | | | | | | | | | | | | | | | ▨ | ▨ | ▨ | ▨ | ▨ | | | |
| Number of Blocks with Defective Cells | 3 | | 3 | 3 | 3 | 3 | 1 | 1 | 1 | 2 | 1 | 1 | 1 | | 1 | | | | | | | | | |

METHOD AND APPARATUS FOR DEFECT REPAIR IN NAND MEMORY DEVICE

CROSS REFERENCE

This application claims priority to and benefit of Chinese Patent Application No. 201410151031.7, filed on Apr. 15, 2014, titled "WEIGHT BASED COLUMN REPAIR ALGORITHM FOR NAND FLASH," the content of which is incorporated herein by reference in its entirety.

TECHNICAL FIELD

Embodiments of the present disclosure relate generally to the field of memory devices, and in particular to defect repair mechanisms in NAND memory devices.

BACKGROUND

Flash memory is known for the advantages of providing short access time and superior vibration-proof capability. Generally, flash memory can be of either NOR or NAND type. Compared with NOR flash memory, NAND flash memory has greater storage density and storage capacity, and higher sequential access speed, which makes it more suitable for mass storage devices.

A NAND memory device typically includes multiple blocks of memory cells, each block having an equal number of pages, and each page having an equal number of columns of cells. Each page may include some spare columns to increase reliability of the device, in addition to the main columns used for recording data. Herein, main columns and spare columns are collectively referred to as "data columns."

A NAND flash device may also include redundant columns used for defect repair. For example, if a data column is determined to be defective during a manufacturing test, a repair process may be performed to disable the defective data column and activate a redundant column to replace it. In NAND flash devices, data is usually read/written on a page-wise basis, and erased on a block-wise basis. Therefore, even if only a fraction of memory cells in a block or page are defective, the entire block has to be declared as unusable until it is repaired.

Typically an NAND flash device has only a limited number of redundant columns due to space limitations of the device. Therefore, if the number of defective data columns is greater than the number of redundant columns, it has to be determined which defective data columns are to be disabled and replaced by the redundant columns in the repair process.

SUMMARY

It would be advantageous to provide a mechanism of selecting defective data columns for repair in NAND memory devices with improved computation efficiency and repair performance.

Embodiments of the disclosure employ a computationally efficient method of selecting defective blocks and data columns in a NAND memory device such that the number of defective blocks that can be repaired is substantially optimized. The NAND memory device includes a plurality of blocks, each block having a plurality of data columns and redundant columns. Defective blocks and columns are identified. A defect map may be generated to lay out the locations of the defect columns in terms of column address and block address. For each defective block, a "weight of block" is derived and represents a ratio between the coverage of the defective block and the number of defective data columns within the block. "Coverage" of a particular block represents the number of the total defective blocks that would automatically (e.g., inherently) be repaired as a result of repairing the particular defective block if it is selected for repair. A defective block having the greatest weight of block may be selected for repair provided there are enough redundant columns available for substituting the defective columns in the block.

According to one embodiment of the present disclosure, a method of repairing defects in an NAND memory device includes identifying defective blocks and defective data columns from the NAND memory device. The NAND memory device includes a plurality of blocks. Each block includes a plurality of data columns and a plurality of redundant columns. Each defective data column includes at least a defective memory cell, and each defective block includes at least a defective data column. The method further includes determining a select defective block in the NAND memory device based on a number of affected defective blocks that would be inherently repaired as a result of repairing the select defective block and based on a number of defective data columns in the select defective block.

A weight value may be calculated for a respective defective block in the NAND memory device. The weight value represents a ratio between a total number of defective blocks that would be automatically repaired as a result of repairing the respective defective block and a number of defective data columns in the respective defective block. Weight values of the defective blocks in the NAND memory device are compared to identify the select defective block.

In each round of the repair selection process, weight values for remaining defective blocks are updated based on their remaining defective blocks. An updated weight value is determined based on a total number of remaining defective blocks that would be automatically repaired as a result of repairing the respective remaining defective block and a number of remaining defective data columns in the respective remaining defective block. Additional select defective blocks are then determined for repair based on their updated weight values.

According to another embodiment of the present disclosure, a method of repairing defects in an NAND memory device includes identifying defective pages and defective data columns from the NAND memory device. The NAND memory device includes a plurality of blocks. Each block includes a plurality of pages, where each page includes a plurality of data columns and a plurality of redundant columns. Each defective data column includes at least a defective memory cell. Each defective page includes at least a defective data column. The method further includes determining a select defective page in the NAND memory device based on a number of affected defective pages that would be automatically selected for repair as a result of repairing the select defective page and based on a number of defective data columns in the select defective page; and repairing the select defective page by using redundant columns.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIG. 3 is a map illustrating the distribution and statistics of defective columns in the NAND device that are determined in an exemplary process in accordance with an embodiment of the present disclosure;

FIG. 4 is a map illustrating the distribution and statuses of the defective columns in the second round of the exemplary repair selection process in accordance with an embodiment of the present disclosure;

FIG. 5 is a map illustrating the distribution and statuses of the defective columns in the third round of the exemplary repair selection process in accordance with an embodiment of the present disclosure;

FIG. 6 is a map illustrating the distribution and statuses of the defective columns in the fourth round of the exemplary repair selection process in accordance with an embodiment of the present disclosure;

FIG. 7 shows a map of defective columns in a NAND memory device before repair;

FIG. 8 shows the result of a repair process performed on the NAND memory device in FIG. 7 according to the first approach in the conventional art;

FIG. 9 shows the result of a repair process performed on the NAND memory device in FIG. 7 according to the second approach in the conventional art;

FIG. 10 shows the NAND memory device in FIG. 7 and the number of defective blocks with respect to each particular column which can be used to select columns for repair according to the third approach in the conventional art;

FIG. 11 shows the result of a repair process performed on the NAND memory device in FIG. 7 according to the third approach in the conventional art;

FIG. 12 shows the result of an exemplary repair process performed on the NAND memory device in FIG. 7 according to an embodiment of the present disclosure;

DETAILED DESCRIPTION

Figure 1:
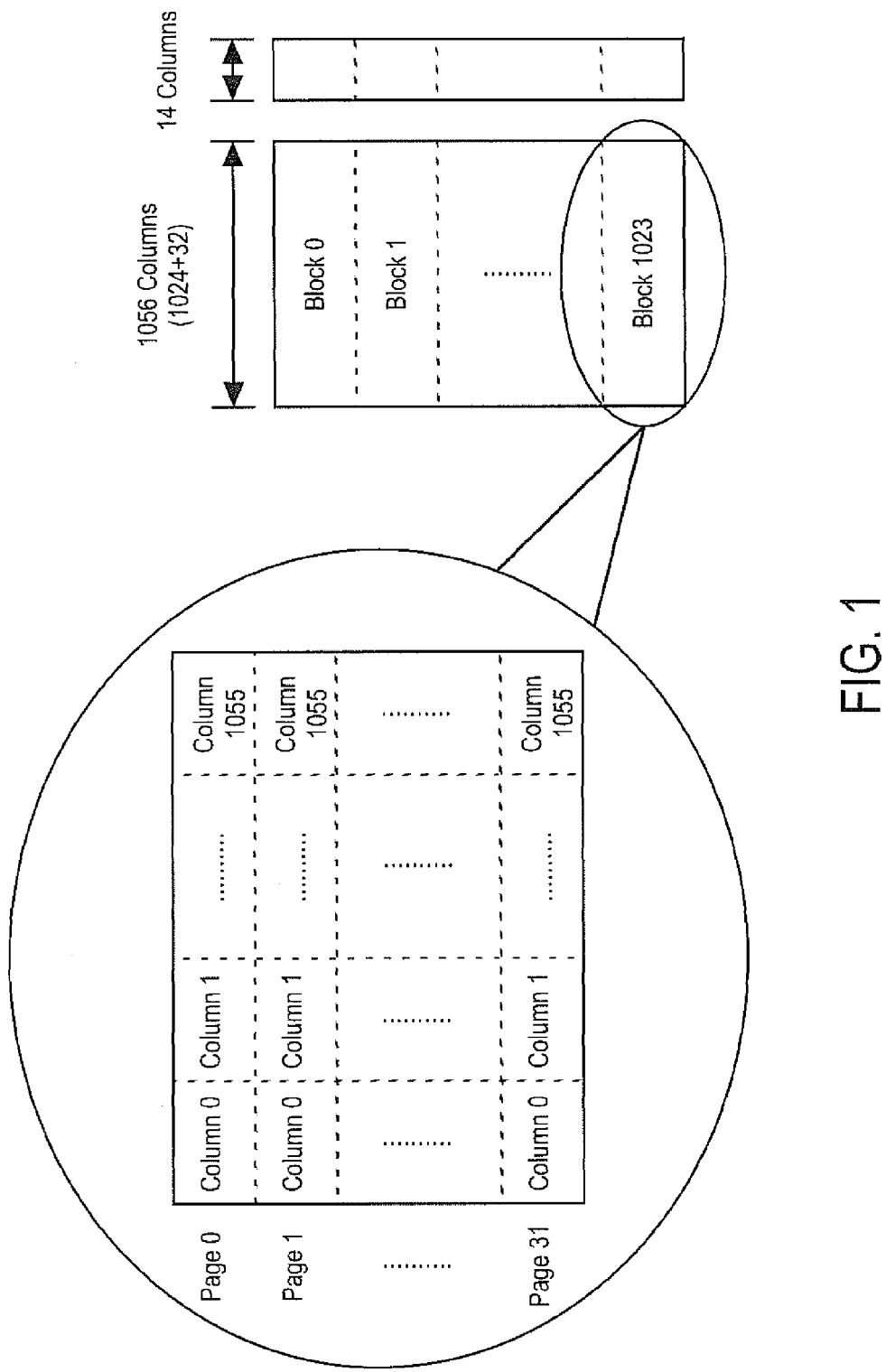
FIG. 1 shows the configuration of an exemplary NAND flash device that can be repaired according to an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

In the following detailed description, for purposes of explanation and not limitation, illustrative embodiments disclosing specific details of the disclosure are set forth in order to provide a thorough understanding of the principle of the present disclosure. However, it will be apparent to those skilled in the art that other embodiments according to the present disclosure can be implemented without the specific details as described herein. Moreover, description of well known devices and methods may be omitted in the description to avoid obscuring the description of the disclosure unnecessarily.

Method and Apparatus for Defect Repair in NAND Flash Device

FIG. 1 shows the configuration of an exemplary NAND flash device that can be repaired according to an embodiment of the present disclosure. The NAND flash device includes 1024 blocks numbered with 0, 1, 2, . . . , 1023. Each of the blocks includes 32 pages, each page including 1056 data columns, e.g., 1024 main columns for recording data and 32 spare columns. Data are stored in the memory cells in a data column in the unit of byte. It is to be noted that all the numeric values above are illustrative only, and the present disclosure is not limited to specific values.

Figure 2:
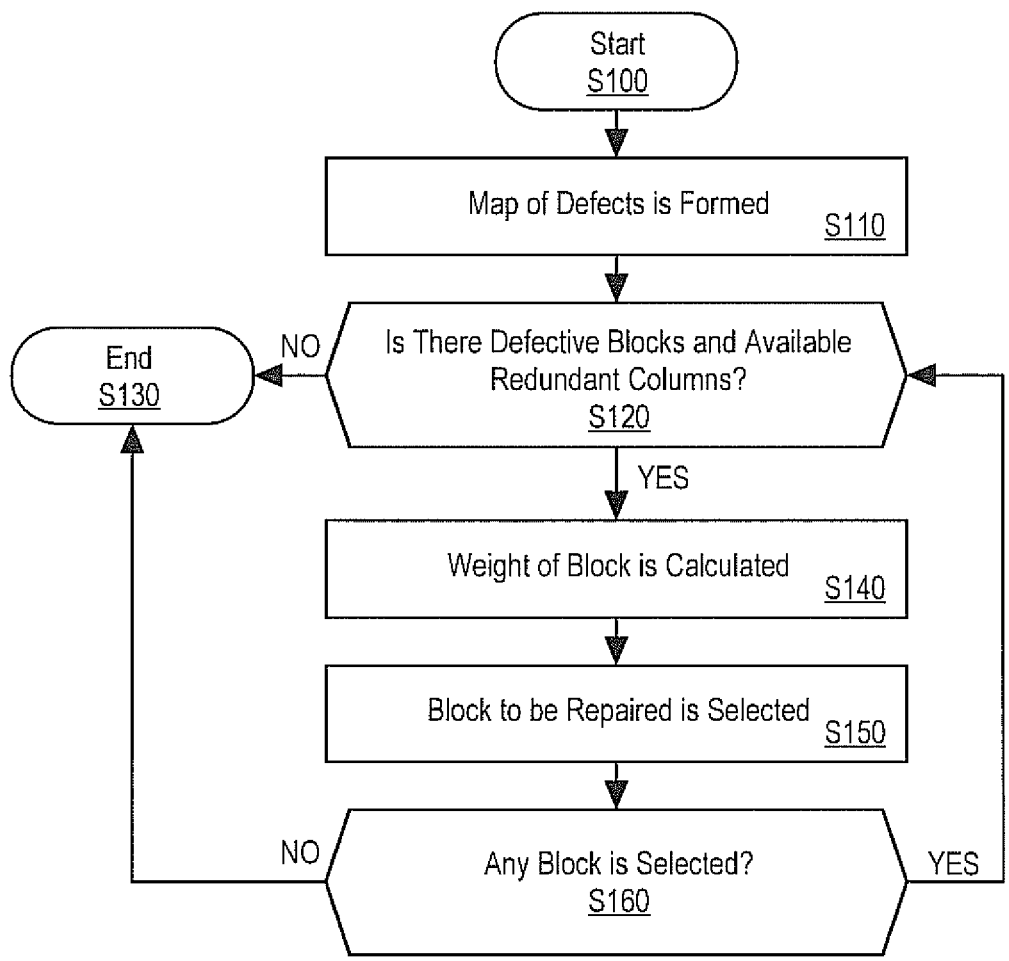
FIG. 2 depicts an exemplary process for selecting defective data columns in an NAND flash device for repair according to an embodiment of the disclosure.

FIG. 2 depicts an exemplary process 200 for selecting defective data columns in a NAND flash device to repair according to an embodiment of the disclosure. Process 200 starts at block S100. At S110, a NAND flash device is tested to locate all the blocks and columns that contain defective memory cells. The identified defective columns are logically mapped based on their locations in terms of block and/or page addresses. As shown in FIGS. 3 and 4, the letter "R" denotes defective data columns.

FIG. 3 is a map illustrating the distribution and statistics of defective columns in the NAND device that are determined in an exemplary process in accordance with an embodiment of the present disclosure. The map shows the locations of defective columns in the NAND devices, statuses of the redundant columns, and several statistic parameters derived from the identified defective columns, including "Number of defective columns," "Coverage of block," "Weight of block," and "remaining redundant columns."

Herein, the maps in FIG. 3-12 are presented to show the distribution and statistics of defective columns in the NAND device, but may not be generated or rendered as a visual representation for users. However, in some embodiments, a map as illustrated can be generated and rendered as a visual representation on a display device for users. The present disclosure is not limited by display format used to show the information that is determined in a column selection and repair process.

Each block includes 16 data columns numbered with hexadecimal numbers from 0 to F, and 5 redundant columns numbered from 0 to 4. It will be appreciated by those skilled in the art that the present disclosure is not limited to any specific number of data columns or redundant columns in a NAND flash device. In addition, a device test process according to the present disclosure is not limited to data columns, and the redundant columns may also be tested. Resulting from the testing, if a memory cell is found to be defective in a certain redundant column, this redundant column will be identified as unusable and excluded from consideration in a subsequent test and repair process.

As shown in FIG. 3, 9 blocks with defective memory cells are identified in the flash device. For example, in block 0, its data columns 0, 2 and 3 contain defective memory cells; and in block 1, its data columns 4, 5, 6 and E contain defective memory cells. The "Number of defective columns" in the map lists the determined numbers of defective data columns in each block.

Referring back to FIG. 2. At S120, based on the information shown in a map, (e.g., as shown in FIG. 3) it is determined whether there is one or more defective blocks, and whether redundant columns are available to repair the defective data columns. If there is no defective block to repair, or there is no redundant column available for the repair, the process 200 ends at S130.

In the example shown in FIG. 3, all the 5 redundant columns are available for repair purposes at this point, so the "remaining redundant columns" parameter values are all equal to 5. At S140 in FIG. 2, the parameter "weight of block" value is calculated for each block with defective columns. Typically, when a certain defective data column in a particular block is repaired using a redundant column, the corresponding columns in all the blocks in the NAND memory device are automatically (e.g., inherently) replaced. For example, the corresponding columns have the same column address in their respective blocks with the certain defective data column. As a result, in FIG. 3, if data column 2 is replaced with redundant column 0, then after the repair, the access to the memory cells at the location of (block 0, column 2) will be shifted to the memory cells at (block 0, redundant column 0), the access to the memory cells at the location of (block 1, column 2) will be shifted to the memory cells at (block 1, redundant column 0), and so on.

According to the present disclosure, a defective column is selected for repair based on a number of defective blocks that would be automatically repaired as a result of repairing the selected defective block and based on a number of defective data columns in said select defective block. In the examples described herein, a ratio between the two factors is calculated and used as criteria to select a defective column. However, the present disclosure is not limited to any specific formula or other mathematic relation to select a defective column for repair based on these two factors.

The parameter "weight of block" represents an "effectiveness-cost ratio" of repairing an individual defective block in the flash device. The weight of block may be calculated based on two factors: coverage of a block and number of defective columns within the block. Coverage of block refers to the total number of defective blocks that will be completely repaired as a result of repairing a specified block. In one embodiment, weight of block may be determined using the following equation:

$$\text{weight of block} = \text{coverage of block}/\text{number of defective columns within the block}.$$

For example, in FIG. 3, if block 0 is to be repaired, three redundant columns are needed to replace data columns 0, 2 and 3. During the repair process, the two defective columns (data columns 0 and 2) in block 3 will also be automatically repaired and thereby block 3 is free of defective columns. As such, both blocks 0 and 3 are completely repaired as a result of replacing data columns 0, 2 and 3. Similarly, blocks 5 and 6 will also be completely repaired due to the process of repairing block 0. As a result, all the defective memory columns in blocks 0, 3, 5 and 6 are replaced during the repair of block 0, and thus the coverage of block for block 0 is equal to 4 according to the above definition. Since the number of defective columns within block 0 is 3, its weight of block is then calculated as 4/3=1.33. FIG. 3 shows the weights and coverage values of all the blocks.

At S150, a block to be repaired is selected. In this embodiment, a selected block should have a number of defective columns that is less than or equal to the number of remaining redundant columns; otherwise the block cannot be repaired with the currently remaining redundant columns. Among the blocks that meet this requirement, the block having the largest weight of block is selected for repair. In the example shown in FIG. 3, because all the blocks have defective columns less than the remaining redundant columns (5) and Block 0 has the largest weight of block (=1.33), block 0 is therefore selected.

At S160, it is determined whether any block is selected at S150. If no block is selected, the process 200 ends at S130. This may happen, for example, if all of the defective blocks have more defective data columns than the remaining redundant columns. In this case, no more defective blocks are to be selected for repair.

On the other hand, if it is determined (at S160) that a block has been selected for repairing, S120, S140 and S150 are repeated in an iteration. In the illustrated example, three redundant columns are marked in the map as unavailable, and the number of the marked redundant columns is equal to the number of defective data columns in the selected block. The present disclosure is not limited by the process or algorithm of selecting available redundant columns to replace a data column. A redundant column may be selected in various suitable manners. For example, they may simply be determined in a sequential manner.

Upon returning to S120 from S160 for the first time, it is determined at S120 that there remain 5 defective blocks and 2 redundant columns after 4 defective blocks (blocks 0, 3, 5 and 6) have been selected for repair. 3 redundant columns (redundant columns 1, 2, and 3 for instance) have become unavailable. FIG. 4 is a map illustrating the distribution and statuses of the defective columns in the second round of the exemplary repair selection process 200 in accordance with an embodiment of the present disclosure. FIG. 4 shows the replaced data columns and the replacing redundant columns by the shadowed cells.

At S140, the values of weight of block are recalculated for the remaining defective blocks based on their current statuses. Likewise, FIG. 4 shows the values of weight of block as well as the above two factors for the remaining defective blocks. Blocks 0, 3, 5 and 6 are skipped in the current round of repair analysis as they have been repaired in the previous round. At step S150, as it is determined that block 1 is irreparable for having more defective columns than the remaining redundant columns (4 versus 2), block 1 is thus skipped. Among the blocks that have no more than 2 defective columns, block 7 and block 8 equally have the largest values of weight of block (=1.00), and either of them can be selected for repair. In the example as shown in FIG. 4, block 7 is selected. At S160, since there is a block selected (data column 7), the process 200 returns to S120 again.

FIG. 5 is a map illustrating the distribution and statuses of the defective columns in the third round of the exemplary repair selection process 200 in accordance with an embodiment of the present disclosure. At S120, it is determined that there are 4 defective blocks and 1 redundant column remaining. At S140, the values of weight of block are calculated for these remaining defective blocks as shown in FIG. 5. Blocks 0, 3, 5 6, and 7 are skipped in this round of repair analysis as they have been repaired in the previous rounds. At S150, it is determined that blocks 1, 2 and 4 are irreparable for having more defective columns (two columns) than available redundant column (one column), and these blocks are ignored. In this round, only block 8 is repairable and it is selected at step S150. At S160, since there is a block selected (block 8), the process 200 returns to step S120 again. However, because no redundant column in available anymore, the process 200 ends at S130.

After defective data columns are identified and selected through the process 200, a repairing mechanism (e.g. via content addressable memory, etc.) can be employed to execute the repair where the selected defective data columns are substituted with redundant columns. Any suitable repairing mechanism that is well known in the art can be used for purposes of practicing the present disclosure.

Figure 6:
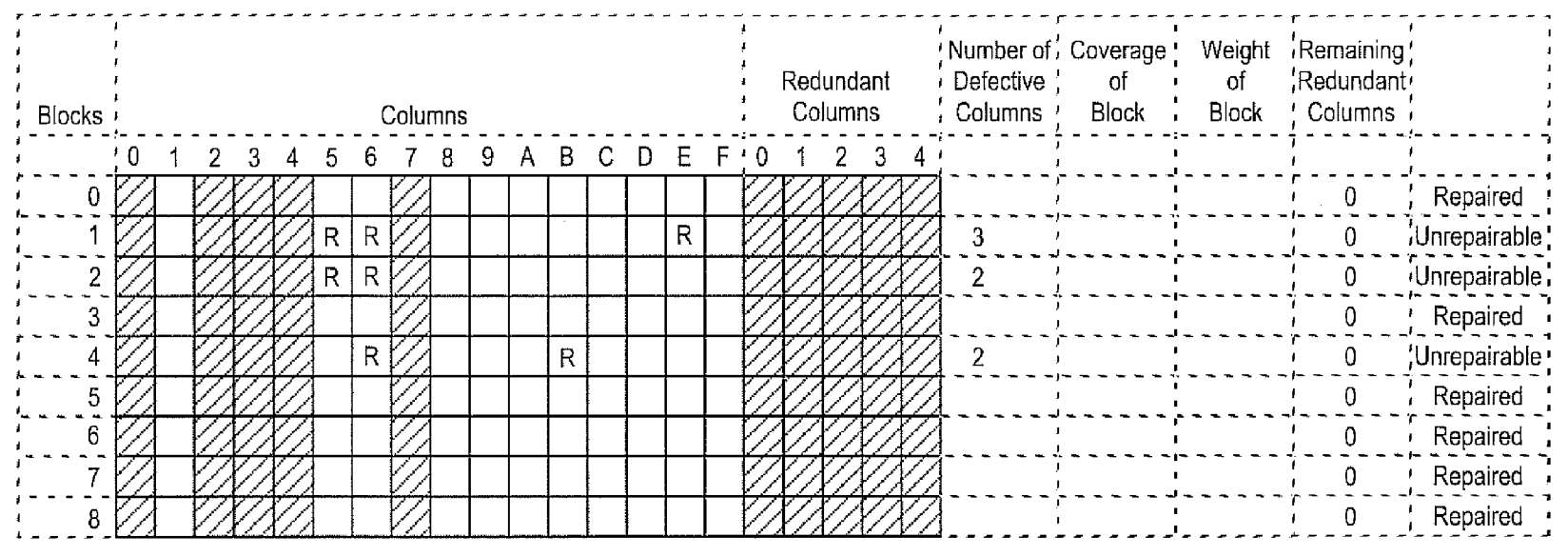

FIG. 6 is a map illustrating the distribution and statuses of the defective columns in the fourth round of the exemplary repair selection process 200 in accordance with an embodiment of the present disclosure. As shown, 5 defective data columns are replaced with the 5 redundant columns, and as a result, 6 defective blocks are completely repaired, namely blocks 0, 3, 5, 6, 7 and 8. The other 3 defective blocks, i.e. blocks 1, 2 and 4 are not completely repaired.

Embodiments of the present disclosure advantageously provide a repair analysis mechanism for selecting defective columns in NAND flash devices for repair with improved efficiency and performance. The following compare the repair results that are obtained using methods according to an embodiment of the disclosure and the conventional approaches.

In a first approach of repairing NAND data columns according to the conventional art, the data columns in an NAND flash device are tested in a sequential manner. Upon a defective data column being identified, it is selected to be repaired by an available redundant column. In other words, the "first seen" defective data columns are repaired until no redundant column is available.

In a second approach, a NAND flash device is tested to identify all the detective data columns, and then all the possible repair solutions are traversed to find out the best one. Unfortunately, this approach is highly demanding in computation resources and time, especially when the number of defective data columns are large.

In a third approach, a NAND flash device is also tested to find all the defective data columns, and then the defective data columns which affect most blocks are selected to be repaired.

In a fourth approach, defective data columns in a NAND flash device are identified and sorted by the number of defective memory cells in these columns. The data columns with the most numbers of defective memory cells are selected to be repaired.

Figures 7, 8:
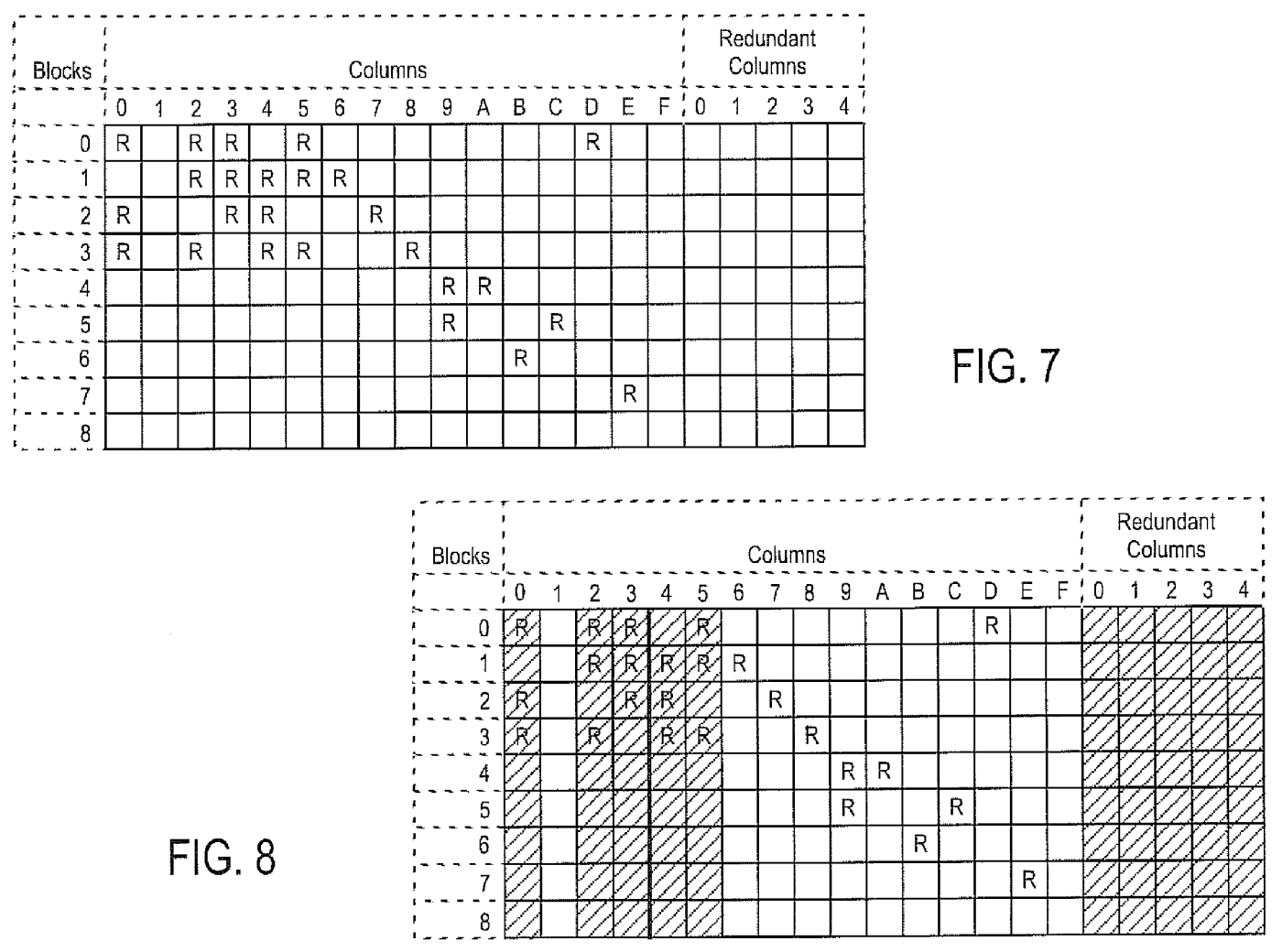

FIG. 7 shows a map of defective columns in a NAND memory device before repair. The device includes 16 data columns and 5 redundant columns. 8 blocks (blocks 0~7) are found to contain defective memory cells as indicated by "R."

FIG. 8 shows the result of a repair process performed on the NAND memory device in FIG. 7 according to the first approach in the conventional art. As shown in FIG. 8, the 5 redundant columns will be used to replace the "first seen" defective data columns, which will be data columns 0, 2, 3 4, and 5 in this example. It is apparent from FIG. 8 that this repair method yields a poor result, as blocks 0~7 each still contain at least one defective data column after the repair process and thus no block is completely repaired.

Figure 9:
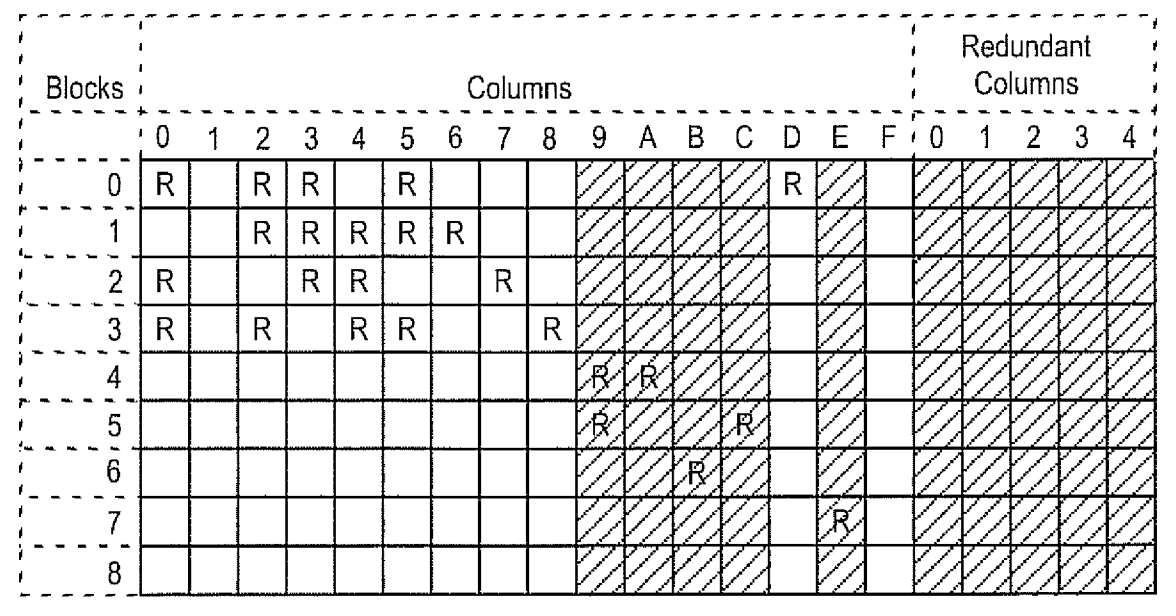

FIG. 9 shows the result of a repair process performed on the NAND memory device in FIG. 7 according to the second approach in the conventional art. All the possible repair solutions are traversed to select the best one. In the repair process, the 5 redundant columns are used to replace defective data columns 9, A, B C and E, and consequently 4 blocks are completely repaired, namely blocks 4, 5, 6 and 7. The result is much better than that obtained by the first approach shown in FIG. 8. However the higher performance is achieved at the cost of much longer calculation time, because all the 2002 possible repair solutions are traversed to determine the best solution. As a general evaluation, if the number of defective data columns is T (14 in the example), and the number of redundant columns is R (5 in the example), then the timing complexity in the second approach will be $C_T^R = T!/R!/(T-R)!$, where the operator "!" indicates factorial operation, and $T! = T \times (T-1) \times (T-2) \ldots \times 2 \times 1$. For a real-life NAND memory device that usually has hundreds or thousands of data columns or even more, the required computing resource can be prohibitively huge.

Figure 10:
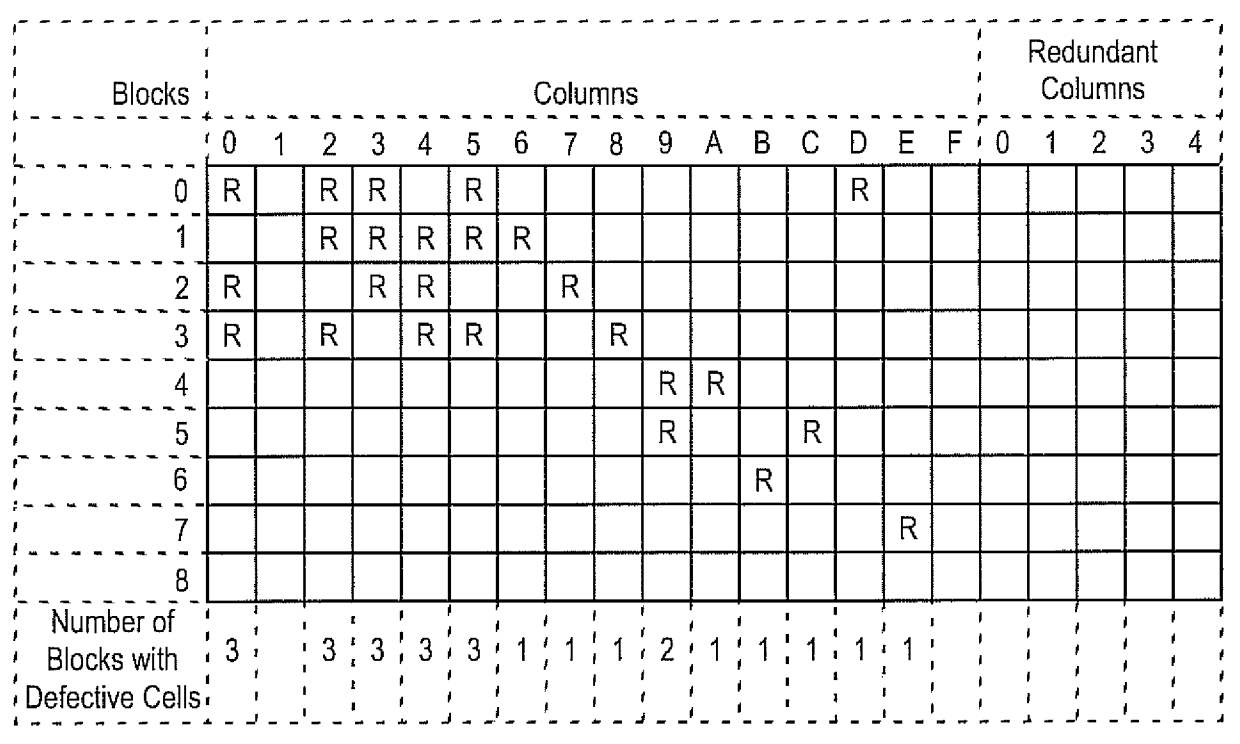
Figure 11:
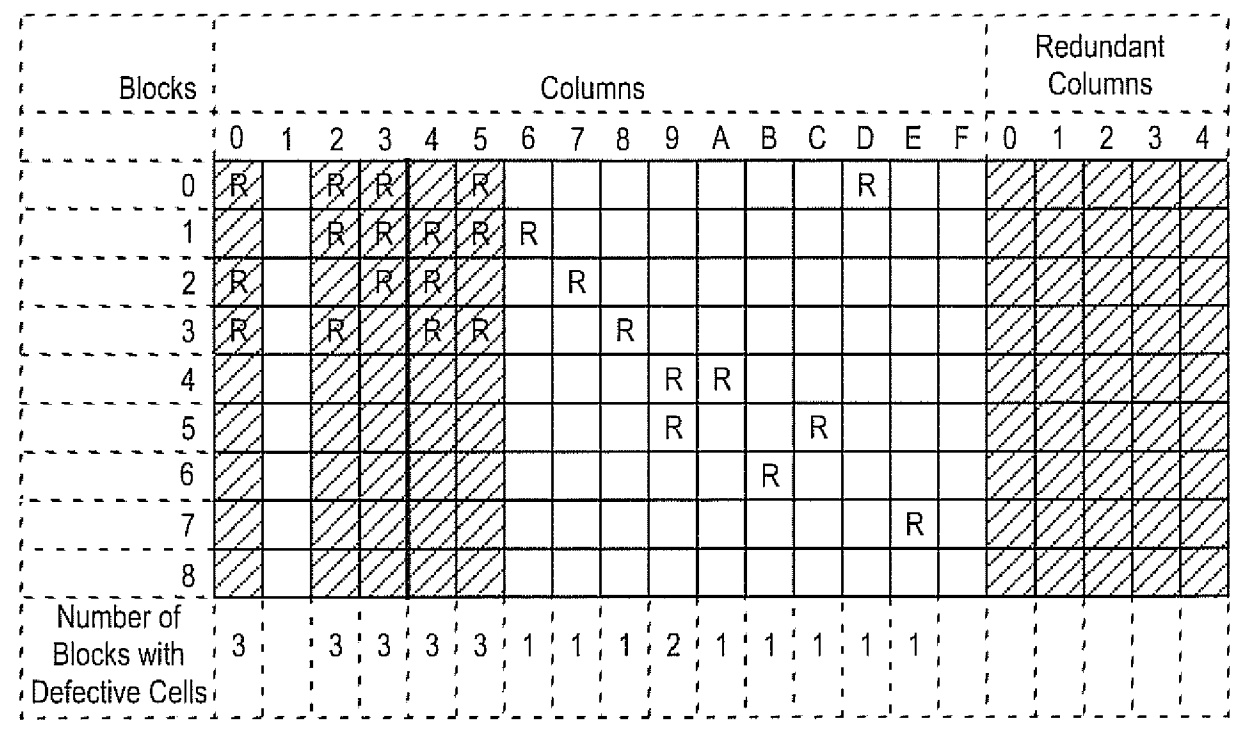

In the third conventional approach, the defective data columns that affect most blocks are selected to be repaired. FIG. 10 shows the NAND memory device in FIG. 7 and the number of defective blocks with respect to each particular column which can be used to select columns for repair according to the third approach in the conventional art. For each data column, the number of blocks that have defective cells on that column are calculated, shown in FIG. 10. As repairing data columns 0, 2, 3 4, and 5 affects most blocks (3 blocks for each of the columns), these 5 data columns are selected to be replaced with the redundant columns. FIG. 11 shows the result of a repair process performed on the NAND memory device in FIG. 7 according to the third approach in the conventional art. The result is unsatisfactory as blocks 0~7 each still contain at least one defective data column after the repair process and thus no block is completely free of defective cells.

According to the fourth conventional approach, the data columns with the most numbers of defective memory cells are selected for repaired. The result from such a repair process is similar with a process using the third conventional approach as presented in FIG. 11.

FIG. 12 shows the result of an exemplary repair process performed on the NAND memory device in FIG. 7 according to an embodiment of the present disclosure. The weight of block for each of the defective blocks is shown on the map. An exemplary process of selecting the defective data columns has been described in greater detail with reference to FIGS. 2-6. As shown, 4 blocks (blocks 4, 5, 6 and 7) are completely repaired. In addition, the timing complexity for the method is approximately in the order of O(n×n), where n indicates the number of defective blocks (8 in this example). Thus the exemplary process according to the present disclosure consumes much less computing resources than the second conventional approach.

Embodiments of the present disclosure advantageously provide a fast and efficient solution for selecting defective columns for repair in NAND memory devices by taking into account the factors of defective blocks and columns. By comparison, the conventional approaches only take into account the factors of defective columns. A repair selection process according to the present disclosure may include a redundancy analysis (RA) process, which can be modeled as a non-polynomial (NP) problem (see http://en.wikipedia.org/wiki/NP-complete, retrieved on Mar. 26, 2013). Embodiments of the disclosure well balance both complexity and yield requirements in selecting defective blocks and columns for repair.

In the above illustrative embodiment, when more than one defective blocks are found to have the same biggest weight of block (e.g. blocks 7 and 8 shown in FIG. 4), the "first seen" block (block 7, the first one when traversing these blocks) may be selected. However, the present disclosure is not limited to this. The selection can be made by taking in account additional factors. For example, the block that has the biggest number of defective data columns may be selected. Alternatively, the determination may be manually made by a user. Still alternatively, if the total number of the defective data columns in two or more of these blocks is not more than the remaining redundant columns, the two or more blocks may be simultaneously selected in a single selection iteration.

The above embodiments utilize the processes of detection and repair of defective memory cells at block level. In some other embodiments, the detection and repair can be made at page level. The above exemplary processes described in detail may be adapted to a page level detection and repair process. For example, if a device provides page repair features, the factors of "coverage of block" and "weight of block" are substituted with "coverage of page" and "weight of page" respectively in the process of selecting blocks and columns for repair.

The embodiments described herein may be implemented in various forms of hardware, software, firmware or a combination thereof. When implemented as hardware, a method according to the present disclosure may be executed in a field programmable gate array (FPGA), an application specific integrated circuit (ASIC), a digital signal processor (DSP) or the like. When implemented as software, the embodiment may be implemented in the form of an application program stored in a non-transitory computer readable medium and executed on a machine. The machine is implemented on a computing platform having hardware such as one or more central processing units (CPU), a random access memory (RAM), and one or more input/output (I/O) interfaces. Embodiment of the disclosure may also be implemented as a computer readable medium having instructions stored thereon, and the instructions that, when executed by a processor, causes the processor to perform a method as described above.

A selection process according to the present disclosure is not limited to the particular order of performing various operations as described herein. Some steps may be performed prior to, in parallel with, or posterior to another step or steps. In some embodiment, repair operations of the NAND memory device are executed after the whole repair solution is obtained. In some other embodiments, repair operations may be executed in a plurality of separate operations, and each operation for repair of a column is executed immediately after the data column is selected for repair (e.g., at S150 in FIG. 2). The method may also be applied to other semiconductor devices that have an architecture that is the same as or similar to that of NAND memory device.

Figure 13:
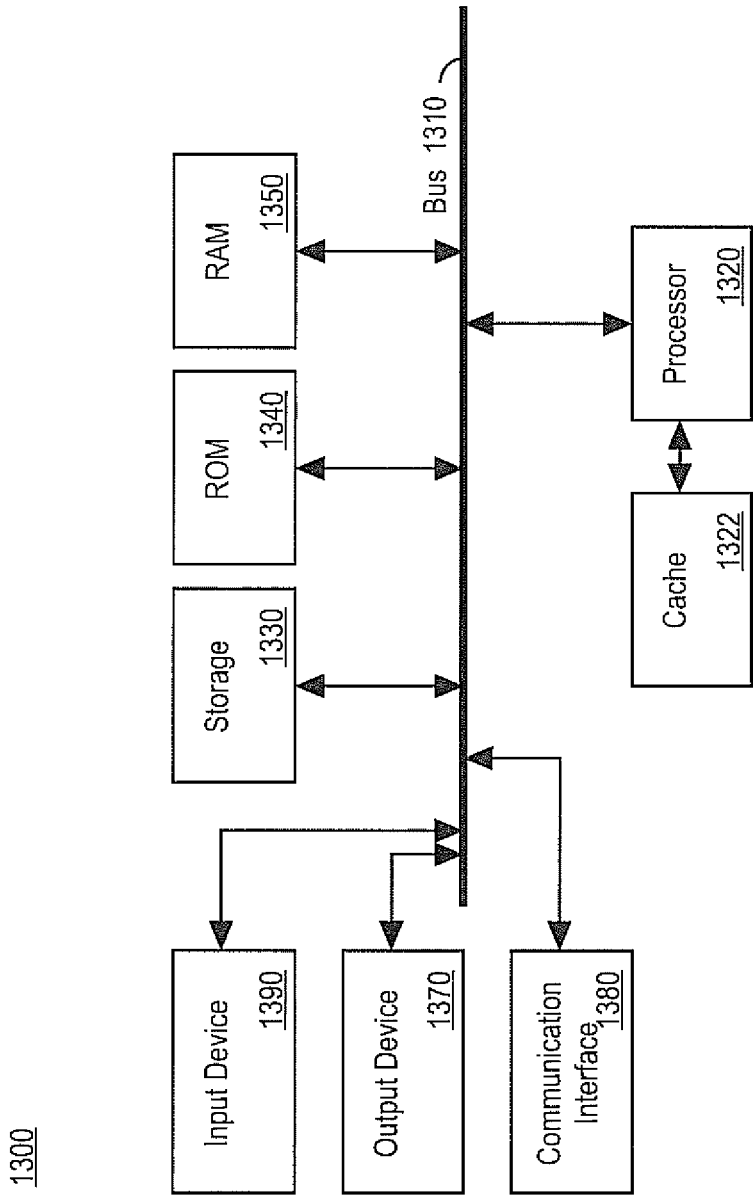
FIG. 13 is a block diagram illustrating a configuration of an exemplary computer 1300 on which embodiments of the present disclosure can be implemented.

FIG. 13 is a block diagram illustrating a configuration of an exemplary computer 1300 on which embodiments of the present disclosure can be implemented, e.g., for executing the steps of FIG. 2. The computer 1300 includes a bus 1310 coupling various components as described below. The computer 1300 includes a processor 1320, which may be one or more central processing unit(s) each having one or more processing cores, graphical processing unit(s) or other processing element(s). The computer 1300 may further include a cache 1322 coupled to the processor 1320 or integrated as a part of the processor 1320. The computer 1300 includes system memory, for example read only memory (ROM) 1340 and random access memory (RAM) 1350. The computer 1300 may further include a storage 1330, which may be a non-volatile computer-readable medium, such as an optical disk, a magnetic disk (e.g. hard disk or floppy disk), an opto-magnetic disk, a memory, and the like. Instructions may be stored on the storage device 1330, and, when executed by the processor 1320, causes the processor to perform a method according to an embodiment of the present disclosure. Data may be copied to the cache 1322 from storage 1330, ROM 1340 or RAM 1350 to avoid delay in the processor 1320 waiting for data and to thereby improve the overall performance.

The computer 1300 may include at least one input device 1390 for interaction between a user and the computer 1300. The input device 1390 may be, for example, a keypad, a mouse, a motion input, an image capturing element, a gravity sensor, a voice receiving element, a touch screen, and so on. The computer 1300 may include at least one output device 1370, which may be common output mechanisms as well known for those skilled in the art, e.g. a speaker, a beeper, a memory light, an image projecting element, a vibration output element, a screen, or a touch screen. The computer 1300 may include a communication interface 1380 for data communication in a wired or wireless manner. For example, the communication interface may have an antenna for transmitting and receiving data based on various cellular protocols, Wi-Fi, Bluetooth, infrared, or Near Field Communication (NFC), and/or comprise a hardware socket based on USB (including micro-USB, mini-USB, etc.), FireWire, HDMI, Lightning, and the like.

Although the disclosure has been described in detail in terms of embodiments with reference to the drawings, it should be noted that the above is illustrative instead of restrictive. Those skilled in the art may recognize various modifications and alternatives within the scope of the disclosure, which is defined only by the appended claims instead of the specific embodiments described above.

What is claimed is:

1. A method of repairing defects in a NAND memory device, said method comprising:
    identifying defective blocks and defective data columns from said NAND memory device, wherein said NAND memory device comprises a plurality of blocks, wherein each block comprises a plurality of data columns and a plurality of redundant columns, wherein each defective data column comprises at least a defective memory cell, and wherein each defective block comprises at least a defective data column; and determining a select defective block in said NAND memory device based on a number of affected defective blocks that would be inherently repaired as a result of repairing said select defective block and further based on a number of defective data columns in said select defective block, wherein said determining said select defective block comprises:
computing a weight value for a respective defective block of said defective blocks in said NAND memory device, wherein said weight value represents a ratio between a total number of defective blocks that would be inherently repaired as a result of repairing said respective defective block and a number of defective data columns in said respective defective block; and
comparing weight values of said defective blocks in said NAND memory device.

2. The method of claim 1 further comprising selecting first redundant columns available for said select defective block; and marking said first redundant columns as unavailable.

3. The method of claim 2 further comprising repairing said select defective block by substituting said defective data columns in said select defective block with said first redundant columns.

4. The method of claim 3 further comprising substituting defective data columns in an affected defective block with second redundant columns, wherein said defective data columns in said affected defective block have same column addresses with said defective data columns in said select defective block, and wherein said first redundant columns have same column addresses with said second redundant columns.

5. The method of claim 1 further comprising:
updating weight values for remaining defective blocks in said NAND memory device, wherein an updated weight value of a respective remaining defective block is determined based on a total number of remaining defective blocks that would be inherently repaired as a result of repairing said respective remaining defective block and a number of remaining defective data columns in said respective remaining defective block;
determining additional select defective blocks based on updated weight values thereof for repair; and
iterating said updating and said determining additional select defective blocks until no redundant column is available.

6. The method of claim 1 further comprising identifying another select defective block for repair, wherein said select defective block and said another selective defective block each have a greatest weight value among said defective blocks in said NAND memory device.

7. The method of claim 1, wherein said determining said select defective block further comprises comparing a number of defective data columns in a respective defective block of said defective blocks with a number of redundant columns available for said respective defective block, and wherein said number of defective data columns in said select defective block is greater than or equal to a number of redundant columns available for said select defective block.

8. A system comprising:
a processor;
memory coupled to said processor and comprising instructions that, when executed by said processor, implement a method of repairing defects in a NAND memory device, wherein said method comprises:
identifying defective blocks and defective data columns from said NAND memory device, wherein said NAND memory device comprises a plurality of blocks, wherein each block comprises a plurality of data columns and a plurality of redundant columns, wherein each defective data column comprises at least a defective memory cell, and wherein each defective block comprises at least a defective data column; and
determining a select defective block in said NAND memory device based on a number of affected defective blocks that would be inherently repaired as a result of repairing said select defective block and further based on a number of defective data columns in said select defective block, wherein said determining said select defective block comprises:
computing a weight value for a respective defective block of said defective blocks in said NAND memo device, wherein said weight value represents a ratio between a total number of defective blocks that would be inherently repaired as a result of repairing said respective defective block and a number of defective data columns in said respective defective block; and
comparing weight values of said defective blocks in said NAND memory device.

9. The system of claim 8, wherein said method further comprises:
selecting first redundant columns available for said select defective block;
marking said first redundant columns as unavailable; and
repairing said select defective block by substituting said defective data columns in said select defective block with said first redundant columns.

10. The system of claim 9, wherein said method further comprises substituting defective data columns in an affected defective block with second redundant columns, wherein said defective data columns in said affected defective block have same column addresses with said defective data columns in said select defective block, and wherein said first redundant columns have same column addresses with said second redundant columns.

11. The system of claim 8, wherein said method further comprises:
updating weight values for remaining defective blocks in said NAND memory device, wherein an updated weight value of a respective remaining defective block is determined based on a total number of remaining defective blocks that would be inherently repaired as a result of repairing said respective remaining defective block and a number of remaining defective data columns in said respective remaining defective block;
determining additional select defective blocks based on updated weight values thereof for repair; and
iterating said updating and said determining additional select defective blocks until no redundant column is available.

12. The system of claim 8, wherein said determining said select defective block further comprises comparing a number of defective data columns in a respective defective block of said defective blocks with a number of redundant columns available for said respective defective block, and wherein said number of defective data columns in said select defective block is greater than or equal to a number of redundant columns available for said select defective block.

13. A method of repairing defects in an NAND memory device, said method comprising:
identifying defective pages and defective data columns from said NAND memory device, wherein said NAND memory device comprises a plurality of blocks, wherein each block comprises a plurality of pages, wherein each page comprises a plurality of data columns and a plurality of redundant columns, wherein each defective data column comprises at least a defective memory cell, and wherein each defective page comprises at least a defective data column;

determining a select defective page in said NAND memory device based on a number of affected defective pages that would be inherently selected for repair as a result of repairing the select defective page and further based on a number of defective data columns in said select defective page, wherein said determining said select defective page comprises:

computing a weight value for a respective defective page of said defective pages in said NAND memory device, wherein said weight value represents a ratio between a total number of defective pages that would be inherently selected for repair as a result of selecting said respective defective page for repair and a number of defective data columns in said respective defective page; and comparing weight values of said defective pages in said NAND memory device; and repairing said select defective page by using redundant columns.

14. The method of claim 13 further comprising: selecting first redundant columns available for said select defective page; and declaring said first redundant columns to be unavailable for subsequent repairing, wherein said repairing said select defective page comprises substituting said defective data columns in said select defective page with said first redundant columns, and wherein said plurality of data columns comprise spare columns.

15. The method of claim 13, wherein said repairing said select defective page further comprises substituting defective data columns in an affected defective page with second redundant columns, wherein said selected defective data columns have same column addresses with said defective data columns in said select defective page, and wherein said first redundant columns have same column addresses with said second redundant columns.

16. The method of claim 13, further comprising iteratively determining additional select defective pages based on weigh values thereof for repair until no redundant column is available.

17. The method of claim 13, wherein said determining said select defective page further comprises comparing a number of defective data columns in a respective defective page of said defective pages with a number of redundant columns available for said respective defective page, and wherein said number of defective data columns in said select defective page is greater than or equal to a number of redundant columns available for said select defective page.

* * * * *